US007831938B2

(12) United States Patent
Bowyer et al.

(10) Patent No.: US 7,831,938 B2
(45) Date of Patent: Nov. 9, 2010

(54) INTERACTIVE INTERFACE RESOURCE ALLOCATION IN A BEHAVIORAL SYNTHESIS TOOL

(75) Inventors: Bryan Darrell Bowyer, Newberg, OR (US); Peter Pius Gutberlet, Wilsonville, OR (US); Simon Joshua Waters, Newberg, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 157 days.

(21) Appl. No.: 11/986,329

(22) Filed: Nov. 21, 2007

(65) Prior Publication Data

US 2008/0077906 A1      Mar. 27, 2008

Related U.S. Application Data

(63) Continuation of application No. 10/313,775, filed on Dec. 5, 2002, now Pat. No. 7,302,670, which is a continuation-in-part of application No. 09/839,376, filed on Apr. 20, 2001, now Pat. No. 6,611,952.

(60) Provisional application No. 60/257,923, filed on Dec. 21, 2000.

(51) Int. Cl.
*G06F 17/50* (2006.01)
(52) U.S. Cl. .............................. 716/3; 716/1
(58) Field of Classification Search ................. 716/1–3, 716/18
See application file for complete search history.

(56) References Cited

U.S. PATENT DOCUMENTS 3,624,616 A    11/1971   Patel 4,527,249 A    7/1985   Van Brunt (Continued)

FOREIGN PATENT DOCUMENTS

EP            0848342            6/1998

(Continued)

OTHER PUBLICATIONS

"Innovations in Behavioral Design and Synthesis," Downloaded from http://cynapps.com on Jun. 6, 2003.

(Continued)

*Primary Examiner*—Jack Chiang
*Assistant Examiner*—Binh C Tat
(74) *Attorney, Agent, or Firm*—Klarquist Sparkman, LLP

(57) ABSTRACT

A behavioral synthesis tool that allows a designer to design an integrated circuit using a generic programming language, such as ANSI C or C++, without the need to include timing information into the source code. In one aspect, the source code is read into the behavioral synthesis tool and the user may dynamically allocate interface resources to the design. In another aspect, the dynamic allocation is accomplished through user input, such as a GUI, a command line, or a file. In another aspect, the behavioral synthesis tool automatically analyzes variables in the source code description and assigns the variables to interface resources. In yet another aspect, the variables and interface resources associated with the variables may be displayed in a hierarchical format in a GUI. In still another aspect, the GUI may allow for expanding and collapsing of different layers in the hierarchy. The GUI may also allow for drag-and-drop operations for modifying the allocation of variables to interface resources.

35 Claims, 11 Drawing Sheets

U.S. PATENT DOCUMENTS

| | | | |
|---|---|---|---|
| 5,404,319 | A | 4/1995 | Smith et al. |
| 5,428,740 | A | 6/1995 | Wood et al. |
| 5,541,850 | A | 7/1996 | Zanden et al. |
| 5,555,201 | A | 9/1996 | Dangelo et al. |
| 5,623,419 | A | 4/1997 | Kundert |
| 5,625,580 | A | 4/1997 | Read et al. |
| 5,634,115 | A | 5/1997 | Fitzpatrick et al. |
| 5,673,198 | A | 9/1997 | Lawman et al. |
| 5,727,187 | A | 3/1998 | Lemche et al. |
| 5,764,951 | A | 6/1998 | Ly et al. |
| 5,847,969 | A | 12/1998 | Miller et al. |
| 5,870,308 | A | 2/1999 | Dangelo et al. |
| 5,870,588 | A | 2/1999 | Rompaey et al. |
| 5,880,971 | A | 3/1999 | Dangelo et al. |
| 5,912,819 | A | 6/1999 | Kucukcakar et al. |
| 6,044,211 | A | 3/2000 | Jain |
| 6,053,948 | A | 4/2000 | Vaidyanathan et al. |
| 6,145,117 | A | 11/2000 | Eng |
| 6,195,786 | B1 | 2/2001 | Raghunathan et al. |
| 6,305,006 | B1 | 10/2001 | Markov |
| 6,314,552 | B1 * | 11/2001 | Markov ............... 716/18 |
| 6,360,356 | B1 | 3/2002 | Eng |
| 6,467,075 | B1 * | 10/2002 | Sato et al. ............. 716/18 |
| 6,477,683 | B1 | 11/2002 | Killian et al. |
| 6,477,689 | B1 | 11/2002 | Mandell et al. |
| 6,480,985 | B1 | 11/2002 | Reynolds et al. |
| 6,574,708 | B2 | 6/2003 | Hayter et al. |
| 6,587,995 | B1 * | 7/2003 | Duboc et al. ............. 716/4 |
| 6,611,952 | B1 | 8/2003 | Prakash et al. |
| 6,691,301 | B2 | 2/2004 | Bowen |
| 6,701,501 | B2 | 3/2004 | Waters et al. |
| 6,704,914 | B2 | 3/2004 | Nishida et al. |
| 6,708,144 | B1 | 3/2004 | Merryman et al. |
| 6,711,729 | B1 | 3/2004 | McElvain et al. |
| 6,760,888 | B2 | 7/2004 | Killian et al. |
| 6,769,081 | B1 | 7/2004 | Parulkar |
| 6,917,909 | B1 | 7/2005 | Markov et al. |
| 6,978,430 | B2 | 12/2005 | McElvain et al. |
| 7,134,100 | B2 | 11/2006 | Ravi et al. |
| 7,275,233 | B2 | 9/2007 | McElvain et al. |
| 7,302,670 | B2 | 11/2007 | Bowyer et al. |
| 7,310,787 | B2 | 12/2007 | Prakash et al. |
| 2002/0097269 | A1 | 7/2002 | Batcha et al. |
| 2004/0111692 | A1 | 6/2004 | Bowyer et al. |
| 2004/0143801 | A1 | 7/2004 | Waters et al. |
| 2007/0186205 | A1 | 8/2007 | Yu et al. |
| 2008/0172646 | A1 | 7/2008 | Prakash et al. |

FOREIGN PATENT DOCUMENTS

| | | |
|---|---|---|
| GB | 2367225 | 3/2002 |
| JP | 5-101141 | 4/1993 |

OTHER PUBLICATIONS

U.S. Appl. No. 60/257,923, dated Dec. 21, 2000, Prakash et al.

Ravikumar et al., "Synthesis of Testable RTL Designs," Eleventh International Conference on VLSI Design: VLSI for Signal Processing, IEEE, pp. 187-192, Jan. 4-7, 1998.

Antao et al., "Archgen: Automated Synthesis of Analog Systems," *IEEE Trans. on VLSI Systems*, pp. 231-244 (Jun. 1995).

Antao, "Architectural Exploration for Analog System Synthesis," *Proc. of the IEEE Custom Integrated Circuits Conf.*, pp. 529-532 (May 1995).

Antoniazzi et al., "A Methodology for Control-Dominated Systems CoDesign," *Third International Workshop on Hardware/Software Codesign*, pp. 2-9 (Sep. 1994).

Arnout, "SystemC Standard," *IEEE*, pp. 573-577 (2000).

Buonanno et al., "Application of a Testing Framework to VHDL Descriptions at Different Abstraction Levels," *IEEE International Conf. on Computer Design: VLSI in Computers and Processors*, pp. 654-659 (Oct. 1997).

Camposano, "From Behavior to Structure: High Level Synthesis," *IEEE Design & Test of Computers*, pp. 8-19 (Oct. 1990).

Camposano et al., "Synthesizing Circuits From Behavioral Descriptions," IEEE Trans. on CAD, vol. 8, No. 2, pp. 171-180 (Feb. 1989).

Cong et al., "Combinational Logic Synthesis for LUT Based Field Programmable Gate Arrays," *ACM Trans. on Design Automation of Electronic Systems*, vol. 1, No. 2, pp. 145-204 (Apr. 1996).

Cong et al., "FlowMap: An Optimal Technology Mapping Algorithm for Delay Optimization in Lookup-Table Based FPGA Designs," IEEE Transactions on Computer-Aided Design of Integrated Circuits and Systems, vol. 13, No. 1, pp. 1-12 (Jan. 1994).

De Micheli et al., "The Olympus Synthesis System," *IEEE Design & Test of Computers*, pp. 37-53 (Oct. 1990).

Elliott, *Understanding Behavioral Synthesis: A Practical Guide to High-Level Design*, Ch. 2, pp. 5-23, and Ch. 9, pp. 155-172, Kluwer Academic Publishers (1999).

Francis et al., "Chortle-crf: Fast Technology Mapping for Lookup Table-Based FPGAs," *Proc. of the 28th ACM/IEEE Design Automation Conf.*, pp. 227-233 (1991).

Fuhrman, "Industrial Extensions to University High Level Synthesis Tools: Making it Work in the Real World," *Proceedings of the 28th Conference on ACM/IEEE Design Automation Conf.*, pp. 520-525 (Jun. 1991).

Goering, "Cadence Mounts Synthesis Threat," Electronic Engineering Times, 3 pp., downloaded from http://eetimes.com/news/97/939news/threat.html (document published in 1997).

Hsu et al., "Digital Design From Concept to Prototype in Hours," *IEEE Asia-Pacific Conf. on Circuits and Systems*, pp. 175-181 (Dec. 1994).

Jemai et al., "Architectural Simulation in the Context of Behavioral Synthesis," *Proc. Design Automation and Test in Europe*, pp. 590-595 (Feb. 1998).

Kim et al., "Utilization of Multiport Memories in Data Path Synthesis," *Proc. of the 30th ACM/IEEE Design Automation Conf.*, pp. 298-302 (1993).

Kucukcakar et al., "Matisse: An Architectural Design Tool for Commodity ICs," *IEEE Design & Test of Computers*, vol. 15, Issue 2, pp. 22-33 (Apr.-Jun. 1998).

Liao et al., "An Efficient Implementation of Reactivity for Modeling Hardware in the Scenic Design Environment," *Proc. of the 34th ACM/IEEE Design Automation Conf.*, pp. 70-75 (1997).

Lipton et al., "PDL++: An Optimizing Generator Language for Register Transfer Design," *ISCAS*-90, pp. 1135-1138 (1990).

Ly et al., "Applying Simulated Evolution to High Level Synthesis," *IEEE Trans. on Computer-Aided Design of Integrated Circuits and Systems*, pp. 389-409 (Mar. 1993).

Ly et al., "Scheduling using Behavioral Templates," *Proc. of the 32nd ACM/IEEE Design Automation Conf.*, pp. 101-106 (Jun. 1995).

Marwedel et al., "RAM-Based Architectural Synthesis," *Novel Approaches in Logic and Architecture Synthesis*, pp. 233-244, G. Saucier, Ed. (1995).

McFarland et al., "The High-Level Synthesis of Digital Systems," *Proc. of the IEEE*, vol. 78, No. 2, pp. 301-318 (Feb. 1990).

Middelhoek et al, "From VHDL to Efficient and First-Time-Right Designs: A Formal Approach," *ACM Trans. on Design Automation of Electronic Systems*, vol. 1, No. 2, pp. 205-250 (Apr. 1996).

Park et al., "Sehwa: A Software Package for Synthesis of Pipelines from Behavioral Specifications," *IEEE Trans. on Computer-Aided Design of Integrated Circuits and Systems*, pp. 356-370 (Mar. 1988).

Patel, "A Design Representation for High Level Synthesis," *Proc. of the European Design Automation Conf*, pp. 374-379 (Mar. 1990).

Perkowski et al., "Diades, A High Level Synthesis System," *IEEE International Symposium on Circuits and Systems*, pp. 1895-1898 (May 1989).

Prakash et al., "Techniques for Rapid Implementation of High-Performance FPGAs from Algorithmic C Specification," HDLCon 2001 Technical Program, 9 pp. (Feb. 28, 2001).

Ramachandran et al., "An Algorithm for Array Variable Clustering," *Proc. of the 5th ACM/IEEE European Design and Test Conf.*, pp. 262-266 (1994).

Schmit et al., "Synthesis of Application-Specific Memory Designs," *IEEE Trans. on VLSI Systems*, vol. 5, No. 1, pp. 101-111 (1997).

Schneider, "A Methodology for Hardware Architecture Trade-off at Different Levels of Abstraction," *European Design and Test Conf.*, pp. 537-541 (Mar. 1997).

Séméria et al., "Methodology for Hardware/Software Co-verification in C/C++," *Proc. of the IEEE International High Level Design Validation and Test Workshop HLDVT'99*, 4 pp. (Nov. 1999).

Shirai, "A Design System for Special Purpose Processors Based on Architectures for Distributed Processing," *Proc. of the Design Automation Conf.*, pp. 380-385 (Sep. 1995).

Tanir et al., "A Specification Driven Architectural Design Environment," *Computer*, pp. 26-35 (Jun. 1995).

Thomas, "The System Architect's Workbench," *Proc. of the 25th Design Automation Conf.*, pp. 337-343 (Jun. 1988).

Walker et al., "Behavioral Transformation for Algorithmic Level IC Design," *IEEE Trans. on Computer-Aided Design of Integrated Circuits and Systems*, pp. 1115-1128 (Oct. 1989).

Walker et al., "Increasing User Interaction During High Level Synthesis," *Proc. of the 24th Annual International Symp. In Microarchitecture*, pp. 133-142 (Nov. 1991).

Wolf, "Object-Oriented Co-Synthesis of Distributed Embedded Systems," pp. 553-558 (also published as Wolf, "Object-Oriented Co-Synthesis of Distributed Embedded Systems," *TODAES*, vol. 1, No. 3, pp. 301-314 (1996)).

Zhu et al., "Syntax and Semantics of the SpecC+ Language," Technical Report ICS-97-16, pp. 1-12 (Apr. 1997).

Zivojnovic et al., "LISA—Machine Description Language and Generic Machine Model for HW/SW Co-Design," *IEEE Workshop on VLSI Signal Processing*, pp. 127-136 (Oct. 1996).

* cited by examiner

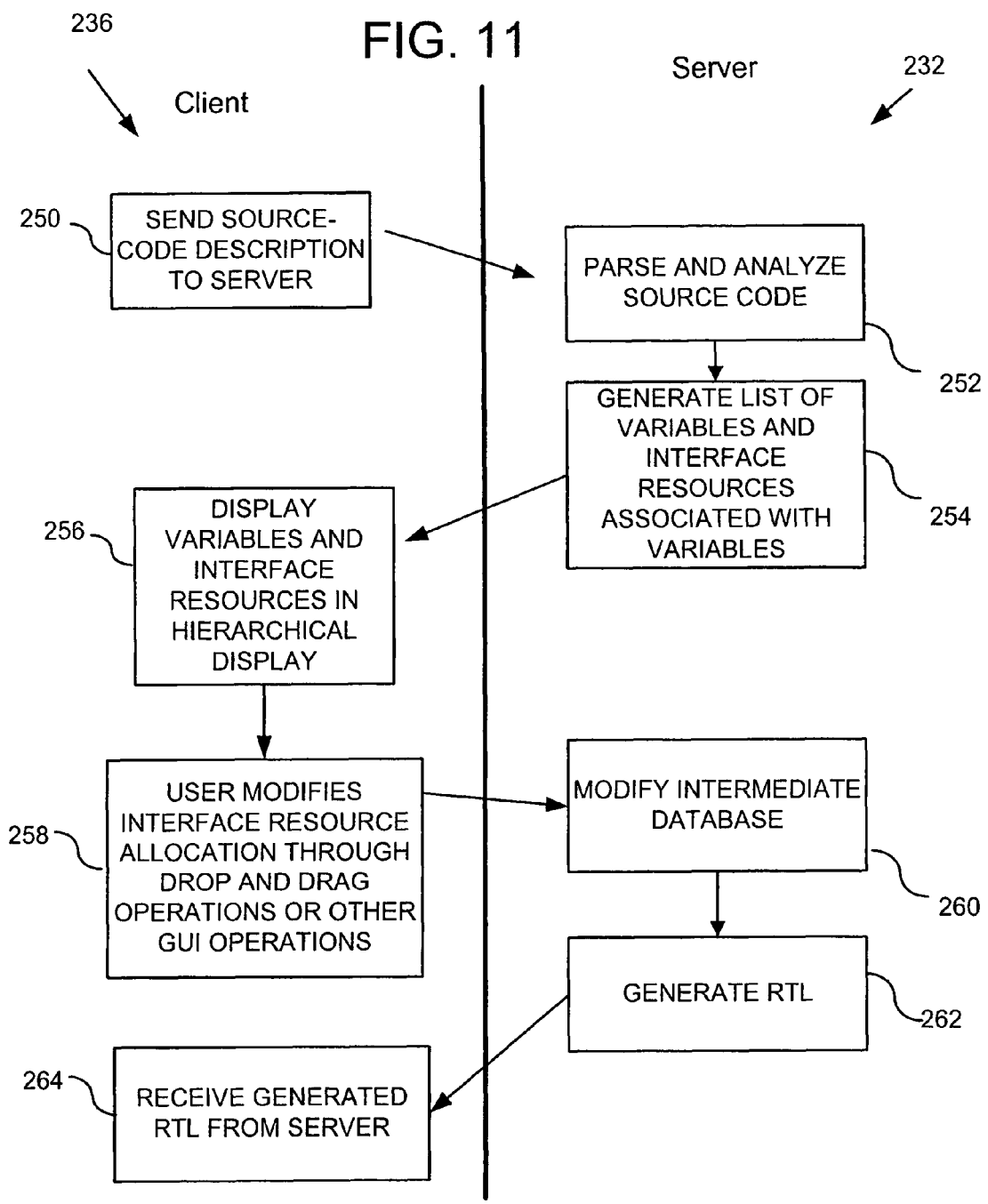

INTERACTIVE INTERFACE RESOURCE ALLOCATION IN A BEHAVIORAL SYNTHESIS TOOL

RELATED APPLICATION DATA

This application is a continuation of U.S. patent application Ser. No. 10/313,775, filed Dec. 5, 2002 now U.S. Pat. No. 7,302,670, which is a continuation-in-part of U.S. patent application Ser. No. 09/839,376, filed Apr. 20, 2001 now U.S. Pat. No. 6,611,952, which claims the benefit of U.S. Provisional Patent Application No. 60/257,923, filed Dec. 21, 2000, all of which are hereby incorporated herein by reference.

TECHNICAL FIELD

The present invention relates generally to behavioral synthesis tools for creating integrated circuits, and more particularly relates to behavioral synthesis tools that allow for interactive interface allocation during the design of integrated circuits.

BACKGROUND

The design of complex computer hardware no longer begins with a circuit diagram. Instead, it begins with a software program that describes the behavior or functionality of a circuit. This software program is written in a hardware description language (HDL)(e.g. VHDL or Verilog) that defines an algorithm to be performed with limited implementation details. Designers direct behavioral synthesis tools to generate alternate architectures by modifying constraints (such as clock period, number and type of data path elements, and desired number of clock cycles). A simulation tool (e.g., Modelsim by Mentor Graphics) simulates the functionality of the system prior to generating a physical implementation of the circuit.

The HDL program is converted into a register transfer level (RTL) description. The RTL description is used to ultimately generate a netlist that includes a list of components in the circuit and the interconnections between the components. This netlist is used to create the physical integrated circuit.

Although describing a system design in HDL provides great flexibility to designers, it is desirable to provide a greater level of abstraction to describe the system functionality. For example, programming languages like C and C++ are now being used as a starting point to describe the function of a circuit. The description of the system in C or C++ is then used by synthesis tools to generate a HDL description of the circuit.

Unfortunately, certain aspects of the system's design cannot be described using conventional ANSI C and C++. For example, C and C++ cannot be used to describe hardware interfaces of the function, which are required to interact with the rest of the integrated circuit. Thus, a designer is forced to describe the functionality of a system design using C and then use HDL constructs to describe the interfaces. However, such a process is time consuming and costly.

Several attempts have been made to adapt conventional C and C++ to add the capability to describe interface components. For example, SystemC is an adaptation of C++ that adds the capability of describing interface elements. However, languages such as SystemC suffer from the same inefficiencies as other HDLs. For example, the programmer is forced to learn the specific language commands, which takes away the benefits of using a generic language such as C or C++.

Thus, there is a need for a tool that allows a designer to use a generic language, such as C or C++, but allows the designer to easily add hardware interfaces.

SUMMARY

The present invention provides a behavioral synthesis tool that allows a designer to design an integrated circuit using a generic programming language, such as ANSI C or C++, without the need to include timing information into the source code. In one aspect, the source code is read into the behavioral synthesis tool and the user may dynamically allocate interface resources to the design. In another aspect, the dynamic allocation is accomplished through user input, such as a GUI, a command line, or a file. In another aspect, the behavioral synthesis tool automatically analyzes variables in the source code description and assigns the variables to interface resources. In yet another aspect, the variables and interface resources associated with the variables may be displayed in a hierarchical format in a GUI. In still another aspect, the GUI may allow for expanding and collapsing of different layers in the hierarchy. The GUI may also allow for drag-and-drop operations to modify the variable/interface resource allocation.

These and other aspects will become apparent from the following detailed description, which makes references to the accompanying drawings.

BRIEF DESCRIPTION OF THE DRAWINGS

FIG. 11 is an example flow chart of a method that may be used to implement the invention on a client server network.

DETAILED DESCRIPTION

Figure 1:
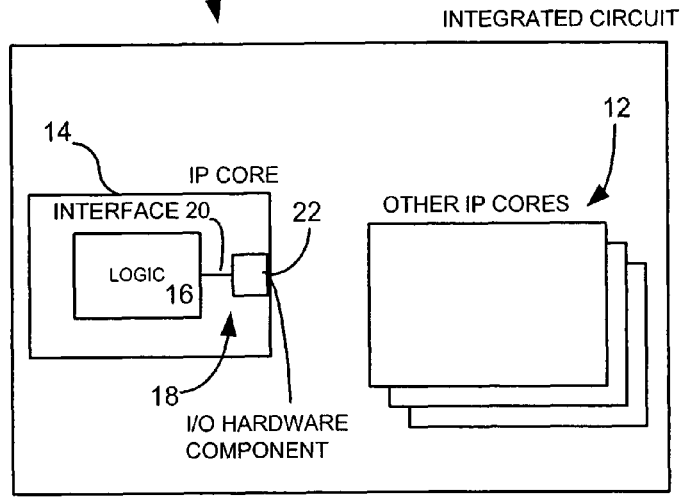
FIG. 1 is a block diagram of an integrated circuit including multiple IP cores, wherein an IP core includes logic and at least one interface resource.

FIG. 1 shows an integrated circuit 10 that includes multiple intellectual property (IP) cores shown generally at 12. A particular IP core is shown at 14 and includes internal logic 16 and one or more interface resources shown generically at 18. As described further below, the logic 16 is generated using a source code description of its functionality programmed in C, C++, or any other high-level programming language. The interface resources 18 are used to couple the logic 16 to the other IP cores 12 or the pins (not shown) of the integrated circuit 10. The interface resource 18 includes an interface 20 and an I/O hardware component 22. As described further below, the I/O hardware component 22 is a component written in a programming language (e.g., RTL). The interface 20 is a set of signals (e.g., control and data signals) used to communicate with the I/O hardware component 22. There are generally three kinds of interface resources: inputs, outputs and inouts. If an input and output variable are mapped to the same resource, it becomes an inout resource.

Turning briefly to FIG. 12, several examples are shown of possible interface resources that may be used. FIGS. 12A-F are illustrated under the assumption that logic 16 is oriented left of the interface resource, while other IP cores 12 or other components communicating with the IP core are oriented on the right side. Also, the I/O hardware components 22 are shown as included by dashed lines, whereas the interface 20 represents the signals for communicating with the I/O hardware components.

Figure 12A:
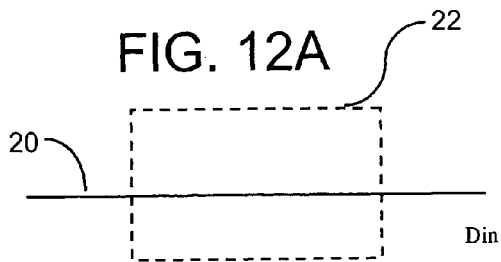
FIGS. 12A-12F show various types of interface resources.
Figure 12B:
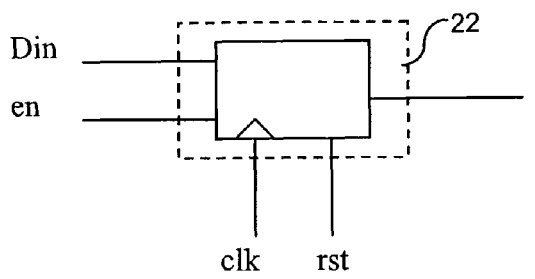
Figure 12C:
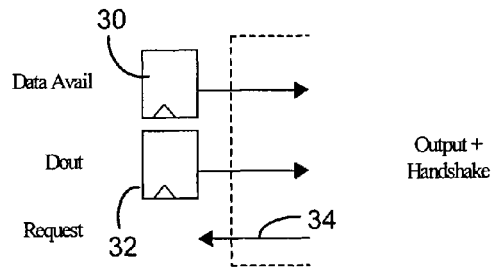
Figure 12E:
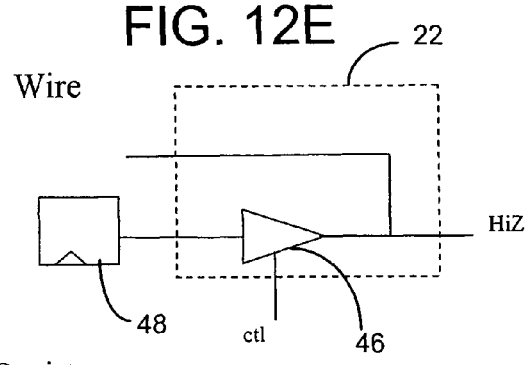
Figure 12F:
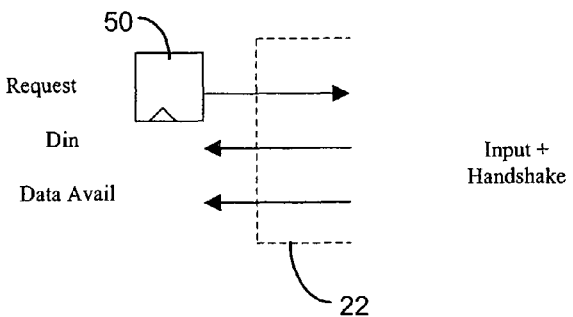
Figure 12D:
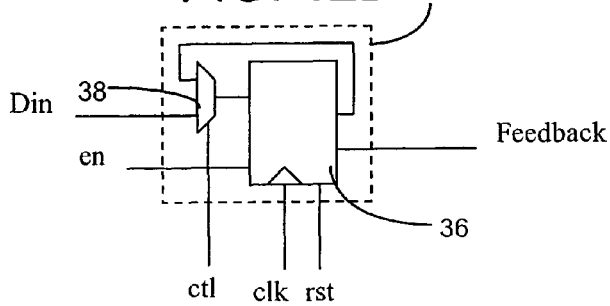

FIG. 12A shows an I/O hardware component 22 that is simply a wire. FIG. 12B shows an I/O hardware component 22 that is a register. In this example the interface 20 includes the set of signals needed to write to the register. FIG. 12C shows registers 30, 32 which may be included in the logic 16 and which are used in combination with request line 34 to output data on register 32 and to provide a handshake mechanism through data available register 30 and request line 34. FIG. 12D shows the I/O hardware component 22 as including a register 36 and a feedback multiplexer 38. The interface 20 includes the set of signals necessary for enabling the register 36, resetting the register, clocking the register, etc. and controlling the multiplexer 38. FIG. 12E shows the I/O hardware component 22 as including a tri-state gate 46, a data-in line (Din) and a data-out line (Dout), wherein a register 48 is within the logic 16. The interface 20 includes the signals for communicating with the I/O component 22 including the control line (Ctl) and data on the Din line. Finally, FIG. 12F shows a I/O hardware component 22 that can receive data through a more complicated handshaking mechanism. A request register 50 is within the logic 16 and is used to request data from other IP cores 12 or from pins within the integrated circuit. Data may then be received on the Din line when available as indicated by the Data Avail line. FIG. 12 shows only a few examples of possible interface resources 18 and others may readily be used as one skilled in the art would readily understand. More complicated interface resources could be designed to handle complete bus protocols. This would keep designers from having to deal with this kind of low-level timing in their high-level behavioral input. Additional buffering or queuing in the interface component may increase parallelism in the design and improve design performance.

Figure 2:
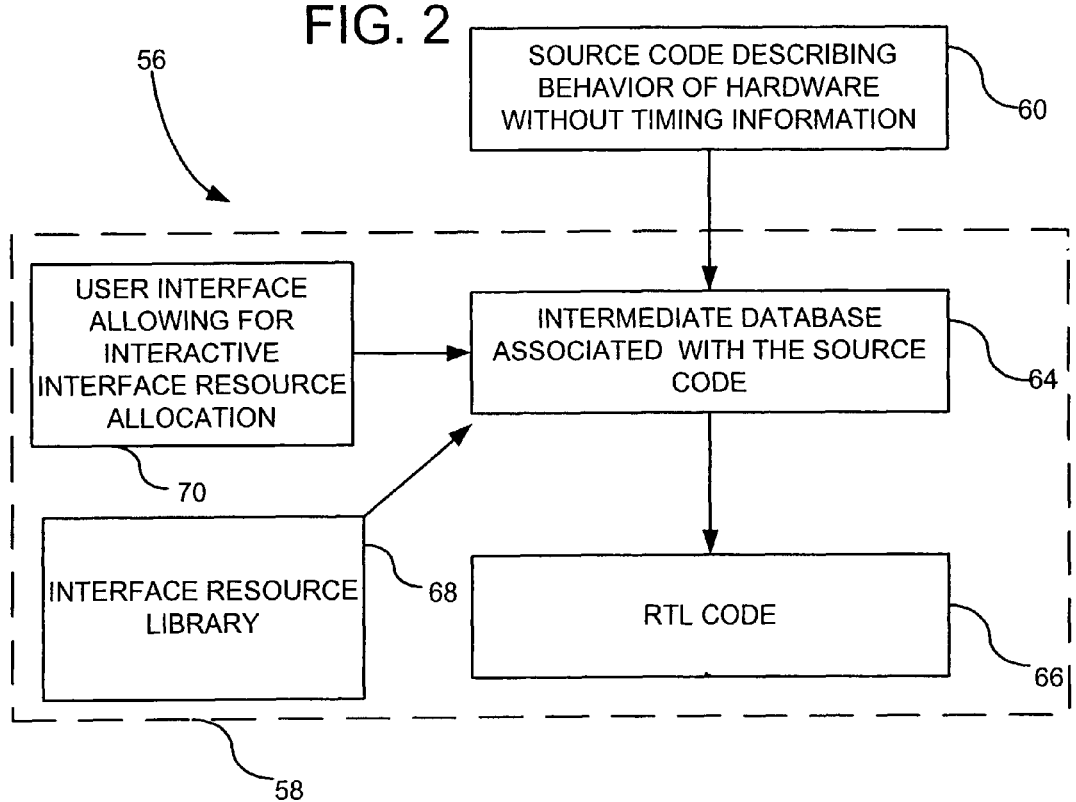
FIG. 2 shows a behavioral synthesis tool that allows a user to interactively modify interface resource allocation.

FIG. 2 shows a system 56, wherein a user may interactively modify the interface resources. Block 60 represents source code describing the behavior of the hardware without including timing information. For example, a typical source code description is programmed in C or C++ or any other high-level programming language and describes the behavior of logic 16 within the IP core 14. The source code is read into an intermediate database 64 within the behavioral synthesis tool 58. This intermediate database may be modified by the user before generating RTL code shown at 66. An interface resource library 68 is also read into the intermediate database 64 and includes the I/O hardware components 22 and interfaces 20 associated with those components. A user interface 70 allows for interactive modification of the interface resources in the intermediate database 64. The user interface may take many forms, such as a graphical user interface, a command line displayed on a monitor, or a file input. Other techniques for inputting data may also be used as is well known in the art.

Figure 3:
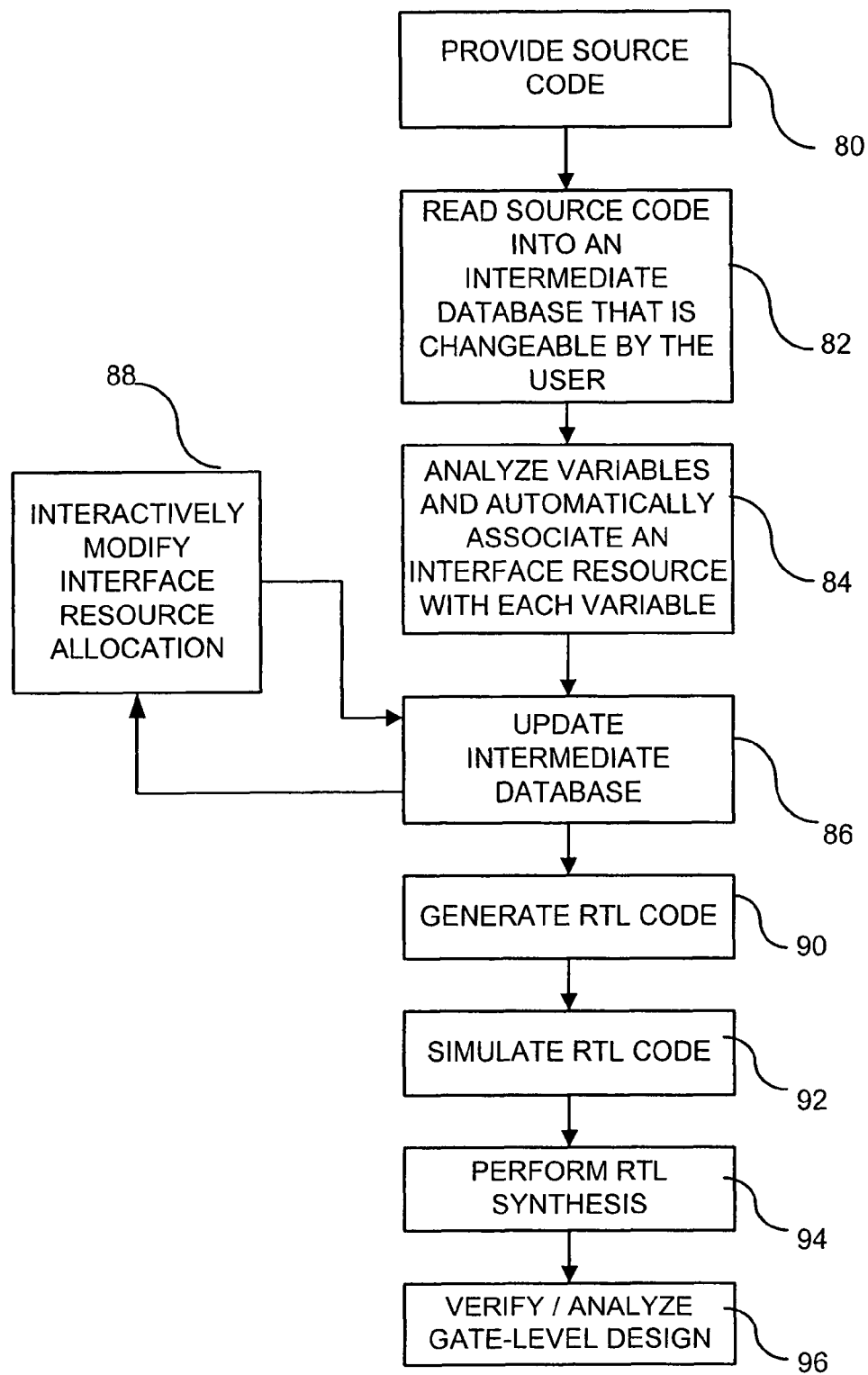
FIG. 3 is a flow chart of a method for interactively modifying the interface resource allocation.

FIG. 3 shows a flow chart of a method for interactively modifying the interface resource allocation without having to modify the source code. In process block 80, the source code description of the logic 16 is provided without timing information. In process block 82, the source code description is read into the intermediate database 64 (FIG. 2). In process block 84, the behavioral synthesis tool 58 analyzes variables within the source code description by parsing the source code description and searching for variable types that are pointers on the function interface or pointers to arrays. Pointers generally are associated with interface resources that need to communicate with other components outside of the logic 16. Once such variables are automatically found within the source code description, an interface resource is obtained and automatically associated with an IO component from the interface resource library 68 and also automatically associated with the variable. To perform this type of assignment, the synthesis tool 58 determines a type associated with the variable. For example, if the variable is read and written, then the interface type is an inout. Thus, a memory that can be both read and written is selected from the interface resource library and assigned to that variable. In process block 86, input is received from the user to update or modify the intermediate database 64. In process block 88, the user interactively modifies the interface resource allocation, as further described below, and such a modification is used to update the intermediate database at 86. It should be noted that interface resources can be allocated to the source code description without modifying the original source code. Thus, a user can interactively modify the interface resources without having to reload the source code and without having to perform an additional compile of the source code that can be time consuming. In process block 90, the RTL code is generated based on the updated intermediate database. In process block 92, the RTL code is simulated and if desired, the user can return (not shown) to the intermediate database and interactively modify the interface resources again if the results of the simulation were not as desired. However, if the user is satisfied with the simulation, then a RTL synthesis is performed at 94. Finally, the gate level design is generated, verified, and analyzed at 96.

Figure 4:
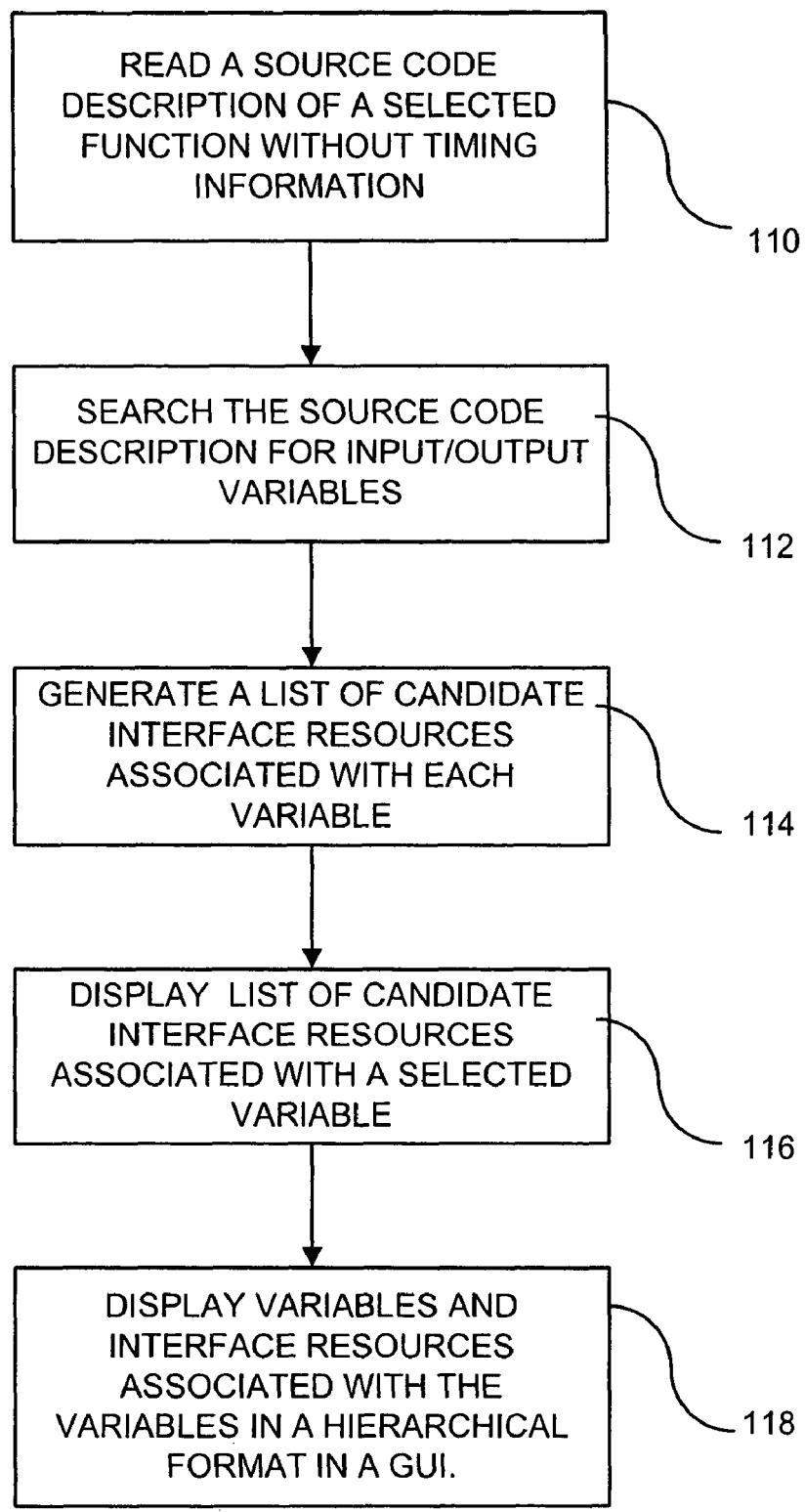
FIG. 4 is a flow chart of a method for displaying interfaces and variables in a hierarchical format.

FIG. 4 shows an example of a flowchart for displaying interface resources in a graphical user interface. In process block 110, the source code description is read into the intermediate database 64 as previously described. In process block 112, the source code is searched for input and output variables (pointers) and inout variables that require the assignment of interface resources. In process block 114, the interface resource library 68 is searched for the possible interface resources that may be used with each variable. In process block 116, if the user chooses to modify an interface resource, the synthesis tool 58 displays a list of candidate interface resources obtained from the interface resource library 68. It should be noted that the candidate interface resources that are displayed are only a subset of the resource library because only resources are displayed which can work with the variable selected by the user. In process block 118, when the user selects a particular interface resource out of the list of candidate resources, the behavioral synthesis tool displays the variables and interfaces associated with the variables in a hierarchical format, as further described below. Under the hierarchical format, one or more variables may be assigned to an interface resource. Each interface resource is then mapped to an interface component.

Figure 5:
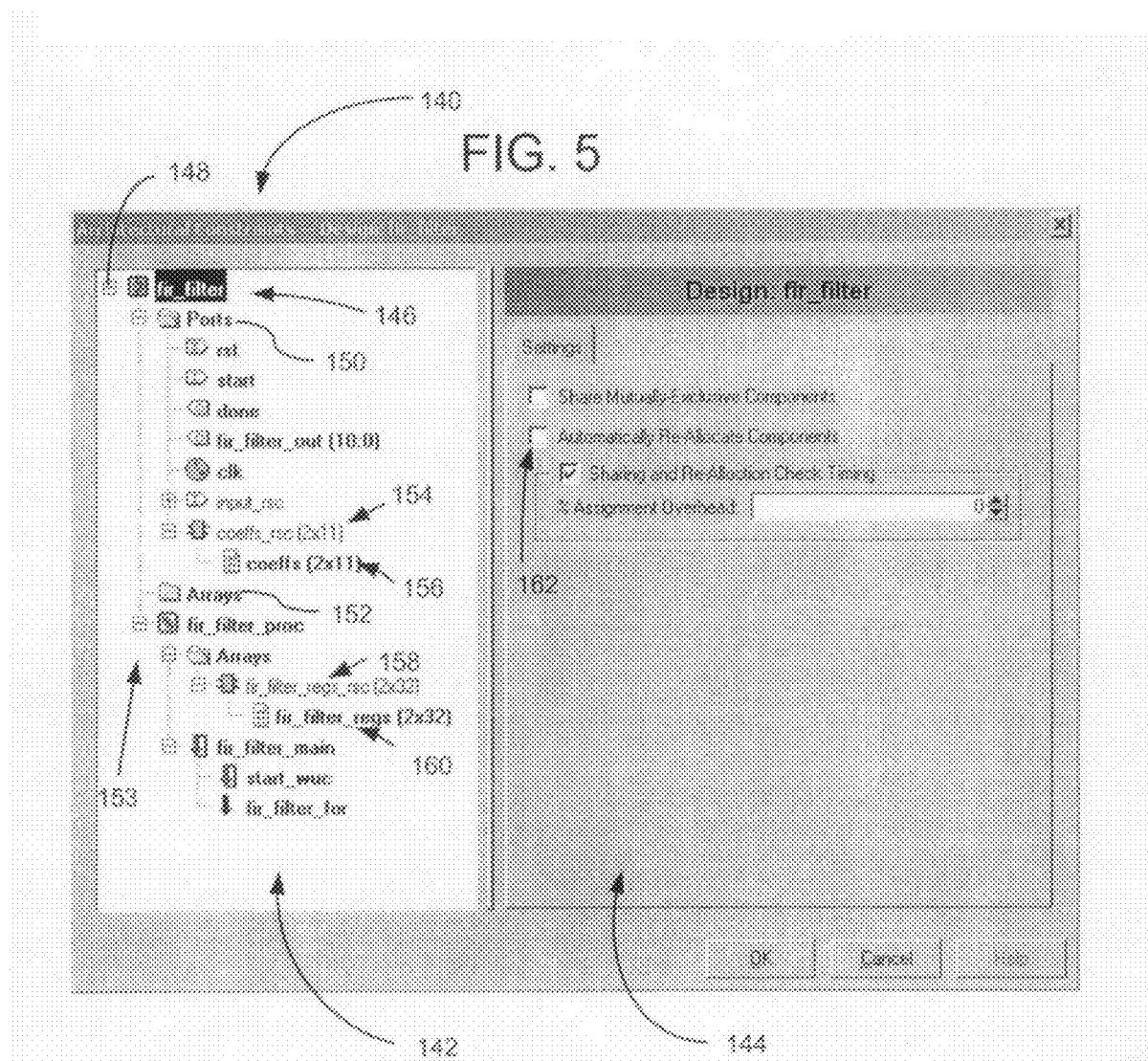
FIG. 5 is an example of a graphical user interface showing a hierarchical display of variables and interface resources associated with those variables.

FIG. 5 shows a graphical user interface (GUI) 140 that shows the interface resources and variables associated with those interface resources in a hierarchical format. The GUI allows a user to map each interface resource to a specific hardware element. In the example of FIG. 5, a source code description (not shown) of a fir filter was read into the behavioral synthesis tool 58. The GUI has two panes shown at 142 and 144. Pane 142 shows the interface resources and variables from the source code in hierarchical format. Pane 144 is used for optionally modifying the interface resource allocation or configuration. At the top of the hierarchy is the design for a filter shown at 146. As shown at 148, the design may be expanded or collapsed using standard GUI techniques. In this example, there are three or more child layers under a parent layer of 146, including ports shown at 150, arrays shown at 152 and one or more processes shown at 153. Each of these child layers typically has additional sub-layers. For example, at 154, an interface resource is shown and, at 156, a variable is associated with that interface resource. Notably the variable 156 (in this example coeffs [2×11]) is shown as a sub-layer under the interface resource 154. An array-type interface resource is shown at 158 with its associated variable shown at 160. In the right hand pane 144, there are several check boxes 162 associated with settings for the process fir filter. As further described below, the right hand pane 144 changes based on the currently-selected element in the hierarchical display 142. Thus, pane 142 displays (for a process) interface resources associated with the process and variable assignments to the interface resources.

Figure 6:
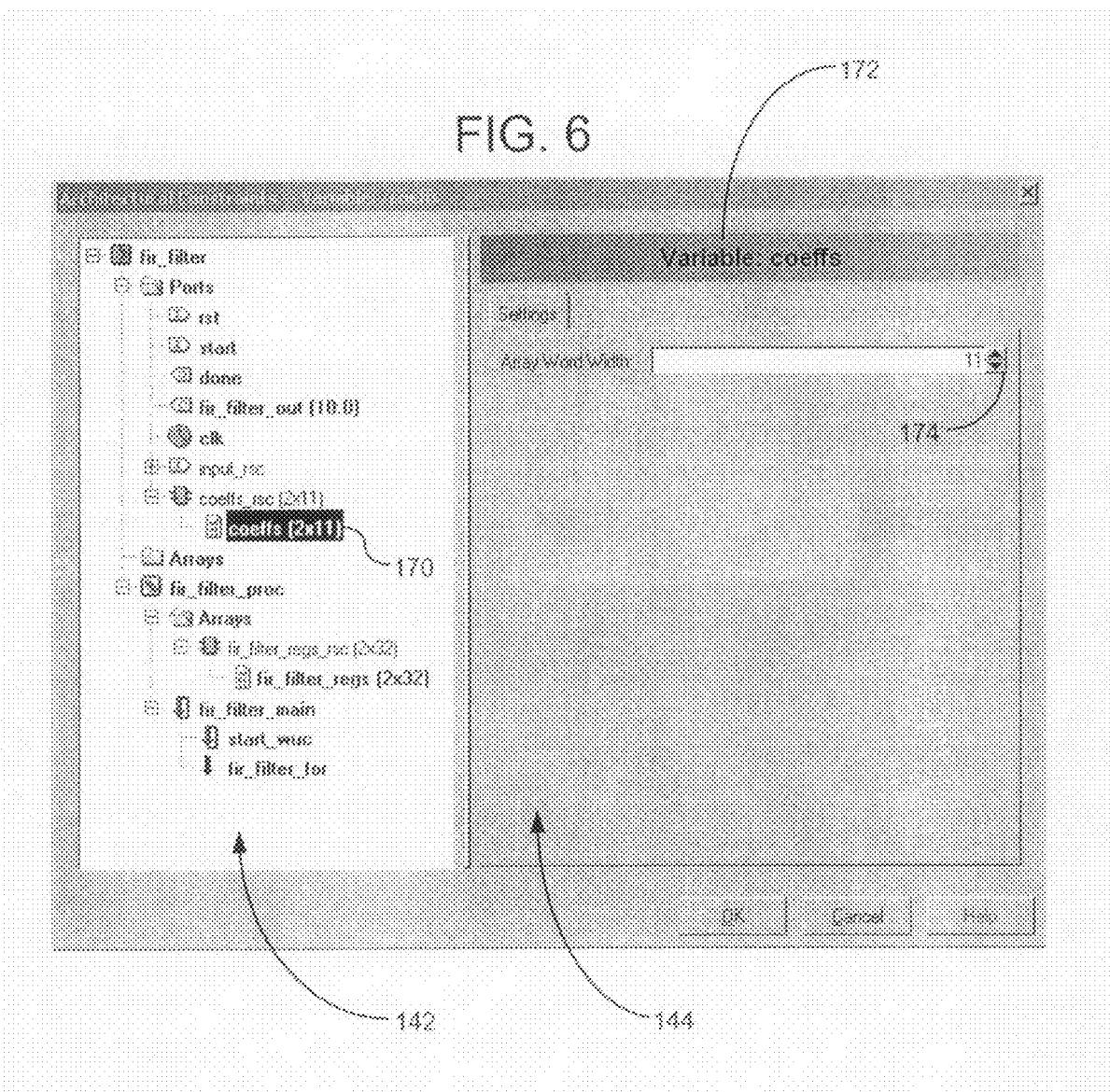
FIG. 6 is an example of a variable selected in the hierarchical display and options for modifying the variable.

FIG. 6 shows an example of a variable 170 selected from the hierarchical pane 142. In pane 144, a title is shown at 172 indicating that the modifiable options displayed in the right pane 144 are associated with the variable "coeffs". For this particular variable, the word width may be modified using the up/down arrows shown at 174 or by typing in the desired value. The word width determines the number of bits in each memory word used to store the variable and allows the user to explore different memory architectures. Thus, using the hierarchical display and GUI, a user can modify a parameter of the variable defined in the source code 60. Instead of updating the source code itself, the user modifies the parameter through the intermediate database 64.

Figure 7:
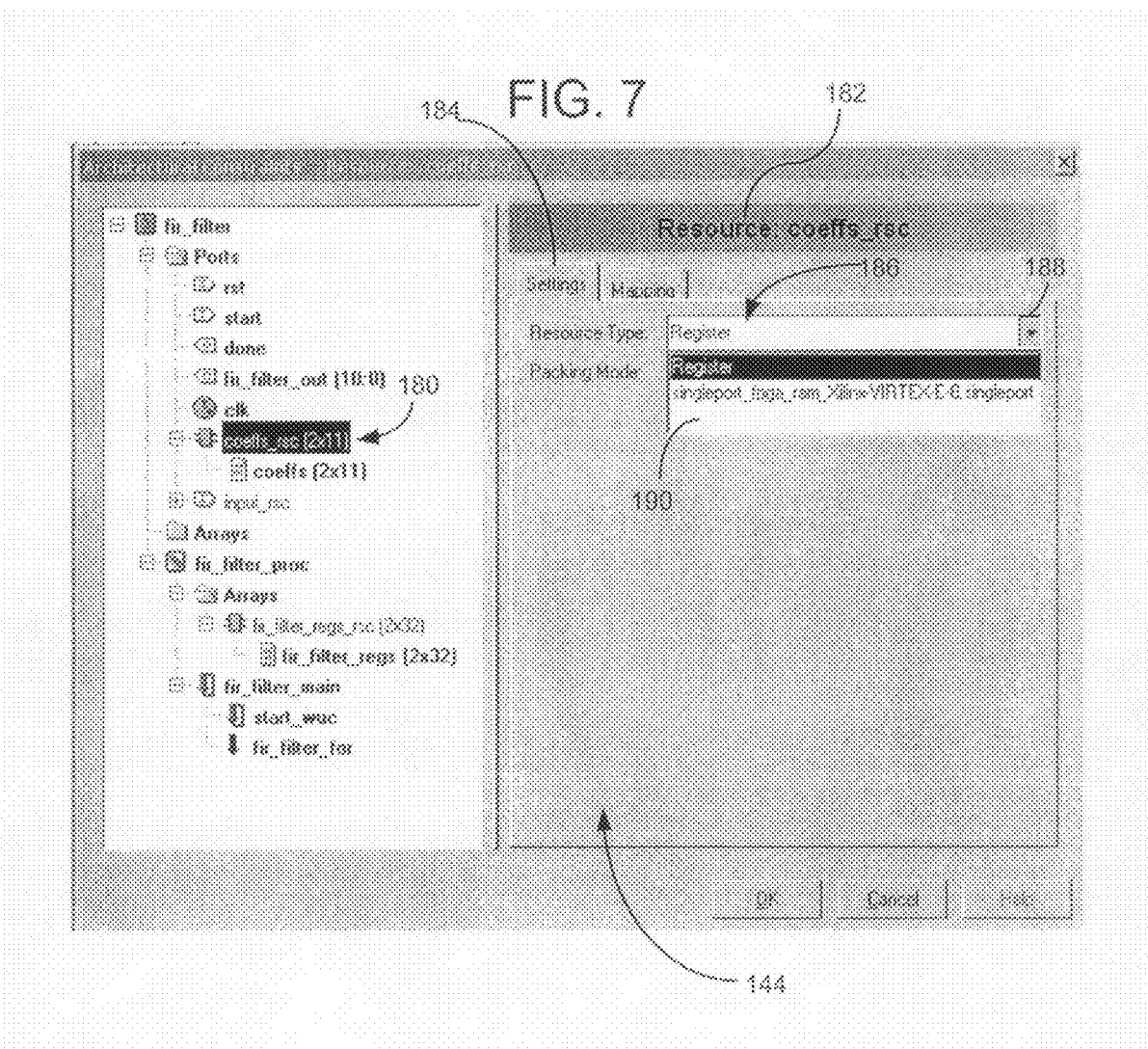
FIG. 7 shows a hierarchical display with an interface resource selected and various options for modifying the interface resource.

FIG. 7 shows an example where the user selects an interface resource at 180. In the right hand pane 144, the title for the resource is shown at 182 and various tabs 184 are displayed organizing the modifiable parameters associated with the resource. For this particular resource, the resource type is modifiable, as shown by field 186. By selecting arrow 188, a drop-down window 190 is displayed showing the different resources that may be used. Only a subset of the resource types available from the interface resource library 68 are displayed. The resource types are automatically selected based on the types from the library 68 that are possible given the variable(s) associated with the resource. In this particular example, the resource may be mapped to a bank of registers or a dedicated memory element like the Virtex II BlockRAM or distributed RAM.

Figure 8:
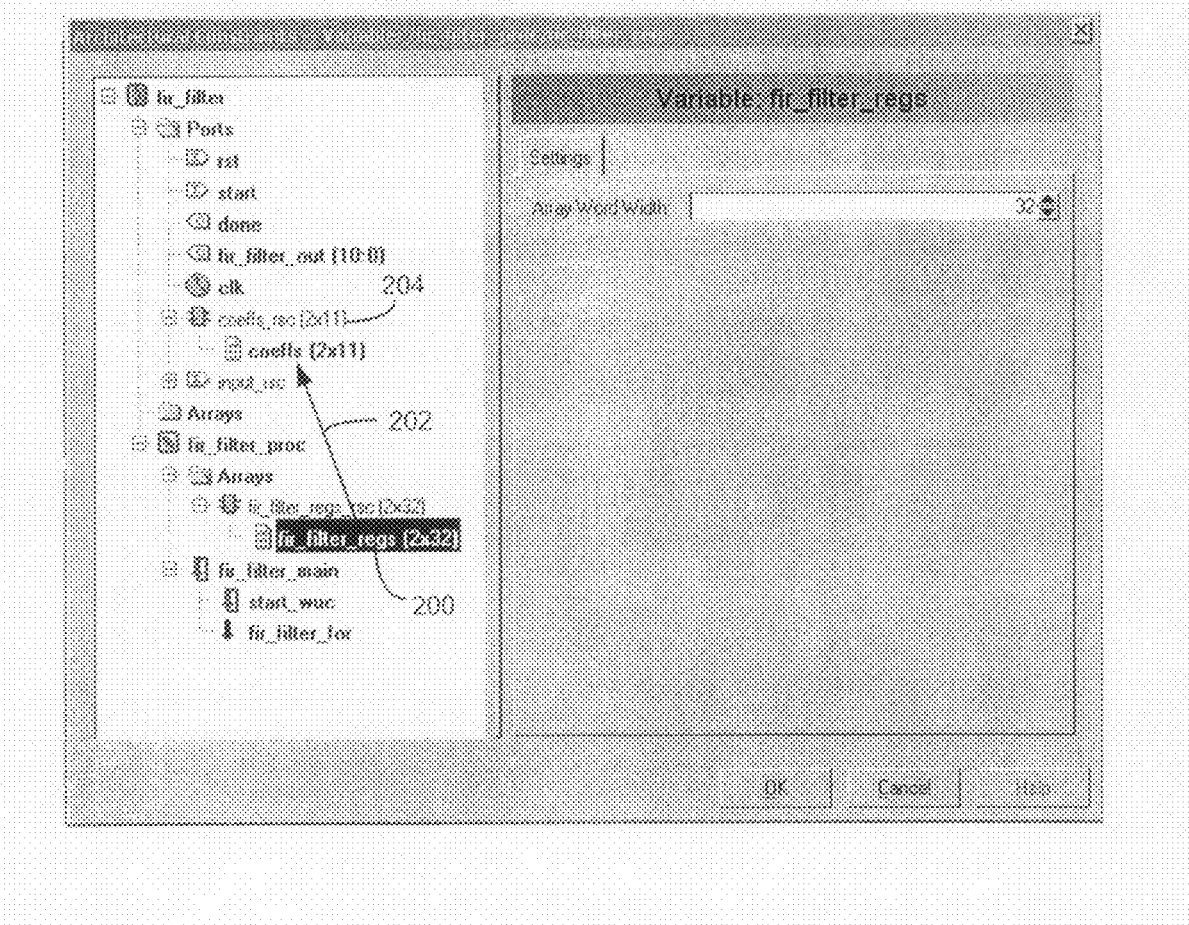
FIG. 8 shows reallocation of variables to interface resources through drag-and-drop operations.
Figure 9:
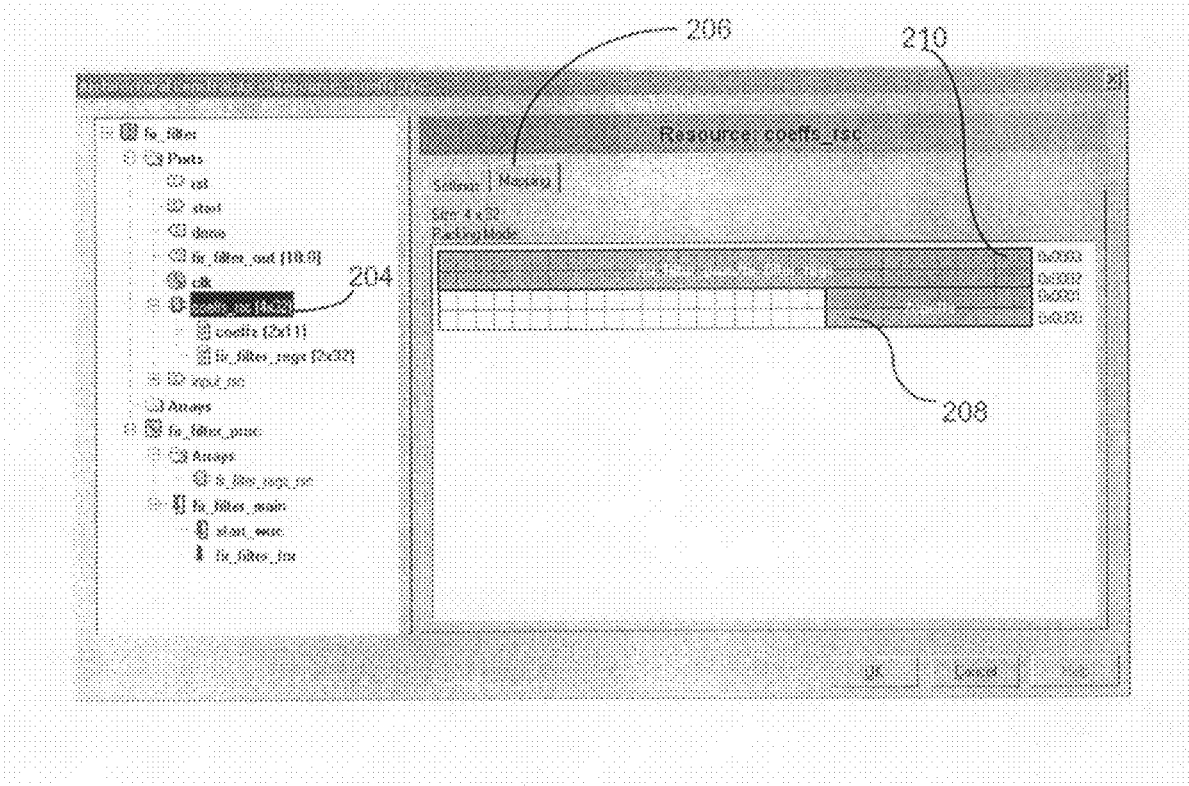
FIG. 9 shows the mapping of variables to an interface resource after a drag-and-drop operation.

FIGS. 8 and 9 show the drag-and-drop feature of the present invention to reassign variables to other resources. For example, if a user selects a variable as shown in FIG. 8 at 200, the user may drag it as indicated at 202 to a different resource shown at 204. In FIG. 8, it should be noted that the resource 204 only has one variable associated with it. After the drag-and-drop operation, the result is shown in FIG. 9 with the resource 204 now having two variables associated with it. The right-hand pane 144 is shown in FIG. 9 as having a mapping tab at 206. The mapping tab 206 shows the packing mode for each of the respective variables within the resource. For example, in this case, the variable "coeffs" is stored in memory (the resource) as shown at 208 whereas "fir_filter_regs" is stored at 210.

Figure 10:
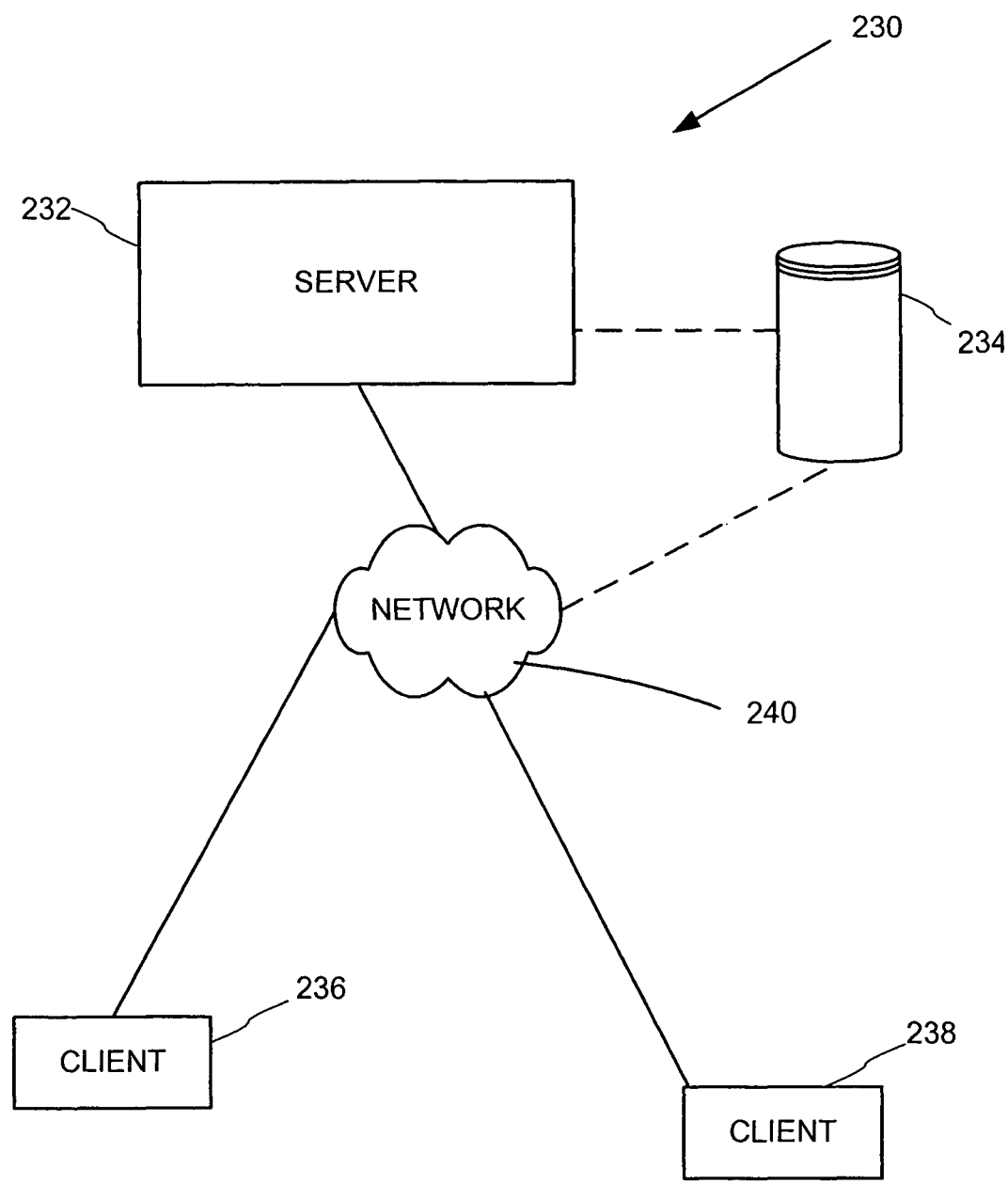
FIG. 10 is a client server network environment that may be used to implement the invention.

FIG. 10 shows that the system may be distributed over a client server network 230. For example, a server computer 232 may have a database 234 associated therewith. One or more client computers shown at 236, 238 may communicate over a network 240, such as the Internet.

FIG. 11 shows a possible scenario for implementing the behavioral synthesis tool over the client-server network 230. For example, in process block 250, the source code description of the process is sent to the server from the client computer. The server may then parse and analyze the source code (process block 252) and generate a list of variables and interfaces associated with those variables (process block 254). The server computer may then send back to the client computer over the network 240 the information necessary to display the variables and interfaces in a hierarchical display (process block 256). In process block 258, the user may modify the interface allocation through drag-and-drop operations or other GUI operations, as previously described, and send those changes back to the server computer 232. The server computer then modifies the intermediate database as shown at 260 and generates the RTL code at 262. The client then may receive the finalized RTL code from the server as indicated at 264.

The interface resource library 68 may be designed in a wide variety of ways. An example is shown below having two parts: first, an I/O Hardware component is generated in RTL code; second, an interface describes the signals for communicating with the component.

Interface Library (Internal Format):

```
component ( "mgc_out_reg" ) {
   parameter ( "width" ) { 1 to ; }
   parameter ( "ph_clk" ) { 0 to 1; }
   parameter ( "ph_en" ) { 0 to 1; }
   parameter ( "ph_arst" ) { 0 to 1; }
   parameter ( "ph_srst" ) { 0 to 1; }
   interface {
     pin ( "clk" ) { direction: in ; bit_width: 1; }
     pin ( "en"   ) { direction: in ; bit_width: 1; value: ph_en; }
     pin ( "arst" ) { direction: in ; bit_width: 1; value: 1-ph_arst; }
     pin ( "srst" ) { direction: in ; bit_width: 1; value: 1-ph_srst; }
     pin ( "ld"   ) { direction: in ; bit_width: 1; value: 0; }
     pin ( "d"    ) { direction: in ; bit_width: width; input_reg; }
     pin ( "lz"   ) { direction: out; bit_width: 1; }
     pin ( "z"    ) { direction: out; bit_width: width; }
   }
   binding ( "write_port" ) {
     pin_mapping {
       pin_association ( "clk" ) { opr_pin: signal; name: "[CLOCK]" ;
       phase: ph_clk; }
       pin_association ( "en"   ) { opr_pin: signal; name: "[ENABLE]";
       phase: ph_en; }
       pin_association ( "arst" ) { opr_pin: signal; name: "[A_RST]" ;
       phase: ph_arst; }
       pin_association ( "srst" ) { opr_pin: signal; name: "[S_RST]" ;
       phase: ph_srst; }
       pin_association ( "ld" ) { opr_pin: constant; value: 1; }
       pin_association ( "d" ) { opr_pin: "D"; }
       pin_association ( "lz" ) { opr_pin: signal; name: "[EXTERNAL]"; }
       pin_association ( "z" ) { opr_pin: signal; name: "[EXTERNAL]"; }
     }
   }
   binding ( "all" ) {
```

```
property_mapping {
  SeqDelay := 0;
  InitDelay := 1;
  Delay := 0;
  Area := 0;
  }
 }
}
```

Hardware Component in RTL (VHDL):

```
      COMPONENT mgc_out_reg
        GENERIC (
          width    : NATURAL;
          ph_clk   : NATURAL RANGE 0 TO 1;
          ph_en    : NATURAL RANGE 0 TO 1;
          ph_arst  : NATURAL RANGE 0 TO 1;
          ph_srst  : NATURAL RANGE 0 TO 1
        );
        PORT (
          clk   : IN std_logic;
          en    : IN std_logic;
          arst  : IN std_logic;
          srst  : IN std_logic;
          ld    : IN std_logic;
          d     : IN std_logic_vector(width-1 DOWNTO 0);
          lz    : OUT std_logic;
          z     : OUT std_logic_vector(width-1 DOWNTO 0)
        );
      END COMPONENT;
      LIBRARY ieee;
      USE ieee.std_logic_1164.all;
      ENTITY mgc_out_reg_pos IS
        GENERIC (
          width    : NATURAL;
          ph_en    : NATURAL RANGE 0 TO 1;
          ph_arst  : NATURAL RANGE 0 TO 1;
          ph_srst  : NATURAL RANGE 0 TO 1
        );
        PORT (
          clk   : IN std_logic;
          en    : IN std_logic;
          arst  : IN std_logic;
          srst  : IN std_logic;
          ld    : IN std_logic;
          d     : IN std_logic_vector(width-1 DOWNTO 0);
          lz    : OUT std_logic;
          z     : OUT std_logic_vector(width-1 DOWNTO 0)
        );
      END mgc_out_reg_pos;
      ARCHITECTURE beh OF mgc_out_reg_pos IS
        FUNCTION active(lval: std_logic; ph: NATURAL
        RANGE 0 TO 1) RETURN BOOLEAN IS
        BEGIN
          CASE lval IS
            WHEN '0' | 'L' =>
              RETURN ph = 0;
            WHEN '1' | 'H' =>
              RETURN ph = 1;
            WHEN OTHERS =>
              RETURN true;
          END CASE;
        END active;
      BEGIN
        PROCESS ( clk, arst )
        BEGIN
          IF active(arst, ph_arst) THEN
            lz <= '0';
            z  <= (others => 'Z');
          ELSIF clk'EVENT AND clk = '1' THEN
            IF active(srst, ph_srst) THEN
              lz <= '0';
              z  <= (others => 'Z');
            ELSIF active(en, ph_en) THEN
              lz <= ld;
              z  <= d;
            END IF;
          END IF;
        END PROCESS;
      END beh;
      LIBRARY ieee;
      USE ieee.std_logic_1164.all;
      ENTITY mgc_out_reg_neg IS
        GENERIC (
          width    : NATURAL;
          ph_en    : NATURAL RANGE 0 TO 1;
          ph_arst  : NATURAL RANGE 0 TO 1;
          ph_srst  : NATURAL RANGE 0 TO 1
        );
        PORT (
          clk   : IN std_logic;
          en    : IN std_logic;
          arst  : IN std_logic;
          srst  : IN std_logic;
          ld    : IN std_logic;
          d     : IN std_logic_vector(width-1 DOWNTO 0);
          lz    : OUT std_logic;
          z     : OUT std_logic_vector(width-1 DOWNTO 0)
        );
      END mgc_out_reg_neg;
      ARCHITECTURE beh OF mgc_out_reg_neg IS
        FUNCTION active(lval: std_logic; ph: NATURAL
        RANGE 0 TO 1) RETURN BOOLEAN IS
        BEGIN
          CASE lval IS
            WHEN '0' | 'L' =>
              RETURN ph = 0;
            WHEN '1' | 'H' =>
              RETURN ph = 1;
            WHEN OTHERS =>
              RETURN true;
          END CASE;
        END active;
      BEGIN
        PROCESS ( clk, arst )
        BEGIN
          IF active(arst, ph_arst) THEN
            lz <= '0';
            z  <= (others => 'Z');
          ELSIF clk'EVENT AND clk = '0' THEN
            IF active(srst, ph_srst) THEN
              lz <= '0';
              z  <= (others => 'Z');
            ELSIF active(en, ph_en) THEN
              lz <= ld;
              z  <= d;
            END IF;
          END IF;
        END PROCESS;
      END beh;
      LIBRARY ieee;
      USE ieee.std_logic_1164.all;
      ENTITY mgc_out_reg IS
        GENERIC (
          width    : NATURAL;
          ph_clk   : NATURAL RANGE 0 TO 1;
          ph_en    : NATURAL RANGE 0 TO 1;
          ph_arst  : NATURAL RANGE 0 TO 1;
          ph_srst  : NATURAL RANGE 0 TO 1
        );
        PORT (
          clk   : IN std_logic;
          en    : IN std_logic;
          arst  : IN std_logic;
          srst  : IN std_logic;
          ld    : IN std_logic;
          d     : IN std_logic_vector(width-1 DOWNTO 0);
          lz    : OUT std_logic;
          z     : OUT std_logic_vector(width-1 DOWNTO 0)
        );
      END mgc_out_reg;
      ARCHITECTURE beh OF mgc_out_reg IS
```

-continued

```
BEGIN
  GENPOS: IF ph_clk = 1 GENERATE
    REGPOS: work.mgc_ioport_comps.mgc_out_reg_pos
      generic map (
        width => width,
        ph_en => ph_en,
        ph_arst => ph_arst,
        ph_srst => ph_srst
      )
      port map (
        clk    => clk,
        en     => en,
        arst   => arst,
        srst   => srst,
        ld     => ld,
        d      => d,
        lz     => lz,
        z      => z
      );
  END GENERATE;
  GENNEG: IF ph_clk = 0 GENERATE
    REGNEG: work.mgc_ioport_comps.mgc_out_reg_neg
      generic map (
        width => width,
        ph_en => ph_en,
        ph_arst => ph_arst,
        ph_srst => ph_srst
      )
      port map (
        clk    => clk,
        en     => en,
        arst   => arst,
        srst   => srst,
        ld     => ld,
        d      => d,
        lz     => lz,
        z      => z
      );
  END GENERATE;
END beh;
```

Having illustrated and described the principles of the illustrated embodiments, it will be apparent to those skilled in the art that the embodiments can be modified in arrangement and detail without departing from such principles.

For example, one skilled in the art will recognize that a non-array pointer can be mapped to a memory interface and an array pointer can be mapped to a non-memory interface. Additionally, a pointer to an array can be mapped to a memory interface.

Although the user input is described as coming from a command line, GUI, or file, those skilled in the art also understand that other user input techniques may be used. For example, the source code may be annotated through the use of pragmas or other means. For example, the source file could be annotated with a pragma such as:

```
int main_design(
  #pragma resource mgc_out_reg
    int *bus_out
);
```

This pragma is similar to a comment in the source code read by the tool and allows the user to use the same simple mechanism of resource selection. The pragma has no defined meaning in the language C, so has no effect on the C compiler. Therefore it is not required to change the input to model the actual behavior of the interface component, which would be impossible (or requires extensions) in C and other high-level languages. Adding pragmas to the source file does not change the behavior of the source, but is simply another way to access functionality of the tool. Pragma statements may also be used in higher-level languages other than C.

Although the source code description is described without timing information, timing information may also be included in the source code in certain embodiments.

In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

We claim:

1. A method comprising:
   loading a programming language source code description, the programming language source code description describing logic in a design for an integrated circuit;
   identifying one or more variables in the programming language source code description, the one or more variables comprising variables that are to be assigned to one or more respective interface resources;
   receiving user input, the user input selecting at least one of the one or more respective interface resources to be assigned to the one or more variables in the programming language source code description; and
   with a computer, generating one or more register-transfer level descriptions of the logic based at least in part on the programming language source code description and incorporating the at least one respective interface resources selected by the user input.

2. The method of claim 1, wherein the user input is received through one or more graphical user interfaces.

3. The method of claim 1, wherein the act of identifying the one or more variables in the programming language source code description comprises:
   storing the programming language source code description as one or more intermediate data structures; and
   searching the one or more intermediate data structures for the one or more variables.

4. The method of claim 1, wherein the act of identifying the one or more variables in the programming language source code description comprises:
   storing the programming language source code description as one or more intermediate data structures; and
   searching the one or more intermediate data structures for one or more pointers on an interface of a function described by the source code description.

5. The method of claim 1, further comprising generating one or more initial interface resource assignments by automatically analyzing the one or more variables to determine one or more types of interface resources associated therewith and automatically assigning an initial interface resource to each of the one or more variables.

6. The method of claim 1, further comprising displaying the one or more variables from the source code description and one or more interface resources associated with the variables in one or more hierarchical formats.

7. The method of claim 1, further comprising parsing the programming language source code description.

8. The method of claim 1, wherein the programming language source code description is in one or more programming languages that do not include timing information.

9. The method of claim 1, wherein the programming language source code description is in C++.

10. The method of claim 1, further comprising storing the one or more register-transfer level descriptions in one or more computer-readable media.

11. The method of claim 1, further comprising making the integrate circuit based at least in part on the one or more register-transfer level descriptions of the logic.

12. The method of claim 1, further comprising fabricating the integrated circuit based at least in part on the one or more register-transfer level descriptions.

13. A computer configured to perform a method, the method comprising:
   loading a programming language source code description, the programming language source code description describing logic in a design for an integrated circuit;
   identifying one or more variables in the programming language source code description, the one or more variables comprising variables that are to be assigned to one or more respective interface resources;
   receiving user input, the user input selecting at least one of the one or more respective interface resources to be assigned to the one or more variables in the programming language source code description; and
   generating one or more register-transfer level descriptions of the logic based at least in part on the programming language source code description and incorporating the at least one respective interface resources selected by the user input.

14. The computer of claim 13, wherein the user input is received through one or more graphical user interfaces.

15. The computer of claim 13, wherein the act of identifying the one or more variables in the programming language source code description comprises:
   storing the programming language source code description as one or more intermediate data structures; and
   searching the one or more intermediate data structures for the one or more variables.

16. The computer of claim 13, wherein the act of identifying the one or more variables in the programming language source code description comprises:
   storing the programming language source code description as one or more intermediate data structures; and
   searching the one or more intermediate data structures for one or more pointers on an interface of a function described by the source code description.

17. The computer of claim 13, the method further comprising generating one or more initial interface resource assignments by automatically analyzing the one or more variables to determine one or more types of interface resources associated therewith and automatically assigning an initial interface resource to each of the one or more variables.

18. The computer of claim 13, the method further comprising displaying variables from the source code description and one or more interface resources associated with the variables in one or more hierarchical formats.

19. The computer of claim 13, the method further comprising parsing the programming language source code description.

20. The computer of claim 13, wherein the programming language source code description is in one or more programming languages that do not include timing information.

21. The computer of claim 13, wherein the programming language source code description is in C++.

22. A method for allocating interface resources in a behavioral synthesis tool used to design an integrated circuit, comprising:
   displaying, in one or more graphical user interfaces provided by a computer, one or more variables from a source code description of a design for the integrated circuit;
   displaying, in the one or more graphical user interfaces provided by the computer, one or more interface resources associated with the one or more variables;
   allowing a user to assign at least one of the one or more variables to the one or more interface resources using the one or more graphical user interfaces provided by the computer; and
   generating one or more register-transfer level descriptions of the integrated circuit based at least in part on the source code description and incorporating the one or more interface resources assigned by the user.

23. The method of claim 22, wherein the assigned one or more variables and one or more interface resources are displayed in one or more hierarchical formats.

24. The method of claim 22, further comprising storing, in one or more computer-readable storage media, a description of one or more assignments of the one or more variables to the one or more interface resources.

25. The method of claim 24, further comprising making the integrated circuit based at least on part on the description of the one or more assignments of the one or more variables to the one or more interface resources.

26. One or more computer-readable media having encoded thereon instructions which, when executed by a computer, cause the computer to perform a method, the method comprising:
   loading a programming language source code description, the programming language source code description describing logic in an integrated circuit design;
   identifying one or more variables in the programming language source code description, the one or more variables comprising variables that are to be assigned to one or more respective interface resources;
   receiving user input, the user input selecting at least one of the one or more respective interface resources to be assigned to the one or more variables in the programming language source code description; and
   generating one or more register-transfer level descriptions of the logic based at least in part on the programming language source code description and incorporating the at least one respective interface resources selected by the user input.

27. The one or more computer-readable media of claim 26, wherein the act of identifying the one or more variables in the programming language source code description comprises:
   storing the programming language source code description as one or more intermediate data structures; and
   searching the one or more intermediate data structures for the one or more variables.

28. The one or more computer-readable media of claim 26, wherein the act of identifying the one or more variables in the programming language source code description comprises:
   storing the programming language source code description as one or more intermediate data structures; and
   searching the one or more intermediate data structures for one or more pointers on an interface of a function described by the source code description.

29. The one or more computer-readable media of claim 26, the method further comprising generating one or more initial interface resource assignments by automatically analyzing the one or more variables to determine one or more types of interface resources associated therewith and automatically assigning an initial interface resource to each of the one or more variables.

30. The one or more computer-readable media of claim 26, the method further comprising displaying the one or more variables from the source code description and one or more interface resources associated with the variables in one or more hierarchical formats.

31. The one or more computer-readable media of claim 26, wherein the programming language source code description is in one or more programming languages that do not include timing information.

32. The one or more computer-readable media of claim 26, wherein the programming language source code description is in C++.

33. One or more computer-readable media having encoded thereon instructions which, when executed by a computer, cause the computer to perform a method for allocating interface resources in a behavioral synthesis tool used to design an integrated circuit, comprising:

displaying, in one or more graphical user interfaces, one or more variables from a source code description of a design of the integrated circuit;

displaying, in the one or more graphical user interfaces, one or more interface resources associated with the one or more variables;

allowing a user to assign at least one of the variables to the one or more interface resources using the one or more graphical user interfaces; and generating one or more register-transfer level descriptions of the integrated circuit based at least in part on the source code description and incorporating the one or more interface resources assigned by the user.

34. The one or more computer-readable media of claim 33, wherein the assigned one or more variables and one or more interface resources are displayed in one or more hierarchical formats.

35. The one or more computer-readable media of claim 33, wherein the source code description does not include timing information.

* * * * *

UNITED STATES PATENT AND TRADEMARK OFFICE
CERTIFICATE OF CORRECTION

PATENT NO. : 7,831,938 B2  Page 1 of 1
APPLICATION NO. : 11/986329
DATED : November 9, 2010
INVENTOR(S) : Bowyer et al.

It is certified that error appears in the above-identified patent and that said Letters Patent is hereby corrected as shown below:

On the Title Page, Item (56)

<u>In the References:</u>

Page 2, line 5, "Zanden et al.," should read --Vander Zanden et al.--.

Page 2, line 62, "Archgen:" should read --ARCHGEN:--.

<u>In the Claims:</u>

Column 10, line 29, "at least one respective" should read --at least one of the one or more respective--.

Column 11, line 2, "integrate circuit" should read --integrated circuit--.

Column 11, line 24, "at least one respective" should read --at least one of the one or more respective--.

Column 12, line 20, "least on part on" should read --least in part on--.

Column 12, line 41, "at least one respective" should read --at least one of the one or more respective--.

Signed and Sealed this
Tenth Day of April, 2012

David J. Kappos
*Director of the United States Patent and Trademark Office*